United States Patent [19]

Katsumata

[11] Patent Number: 5,216,583
[45] Date of Patent: Jun. 1, 1993

[54] DEVICE FOR MOUNTING A FLAT PACKAGE ON A CIRCUIT BOARD

[75] Inventor: Akira Katsumata, Tama, Japan

[73] Assignee: Kel Corporation, Tokyo, Japan

[21] Appl. No.: 731,045

[22] Filed: Jul. 16, 1991

[30] Foreign Application Priority Data

Jul. 18, 1990 [JP] Japan .................. 2-76213[U]
Jul. 18, 1990 [JP] Japan .................. 2-190082

[51] Int. Cl.$^5$ ................... H05K 7/12; H01R 9/16
[52] U.S. Cl. .................... 361/400; 174/52.4;
    361/395; 361/400; 439/68; 439/70; 439/71;
    439/73
[58] Field of Search ......... 361/395, 400, 403, 399;
    174/52.4, 260; 439/68, 70, 71, 72, 73, 58, 271,
    272, 559

[56] References Cited

U.S. PATENT DOCUMENTS

| Re. 31,114 | 12/1982 | Berg | 439/71 |
|---|---|---|---|
| 4,164,003 | 8/1979 | Cutchaw | 439/72 |
| 4,194,800 | 3/1980 | Chow | 439/71 |
| 4,255,003 | 3/1981 | Berg | 439/71 |
| 4,468,074 | 8/1984 | Gordon | 439/72 |
| 4,547,031 | 10/1985 | Korsunsky | 439/73 X |
| 4,692,790 | 9/1987 | Oyamada | 439/71 X |
| 4,717,346 | 1/1988 | Yoshizaki | 439/71 |
| 4,747,017 | 5/1988 | Koors et al. | 361/395 |
| 4,766,371 | 8/1988 | Moriya | 439/68 |
| 4,824,392 | 4/1989 | Billman et al. | 439/72 |
| 4,980,635 | 12/1990 | Walton et al. | 439/68 |
| 5,100,332 | 3/1992 | Egawa | 439/71 |
| 5,100,333 | 3/1992 | Suzuki | 439/73 |

FOREIGN PATENT DOCUMENTS

2-250282  10/1990  Japan .................. 439/70

Primary Examiner—Leo P. Picard
Assistant Examiner—D. Sparks
Attorney, Agent, or Firm—Robert W. J. Usher

[57] ABSTRACT

A device for mounting a flat package on a circuit board, comprises a rectangular base frame attached to the circuit board, a rectangular clamping frame and a cover frame for releasable locking engagement with the base frame for retaining the clamping frame in pressing engagement with a flat package mounted on the circuit board within the base frame. The clamping frame has recesses formed in respective corners and lands forming stop surfaces with elastic strip locating grooves formed on opposite sides thereof. Further elastic strip locating grooves and elastic strip anchoring grooves of constricted cross-sectional size, extend along a lower, clamping face and on the undersides of the lugs. The base frame has contact guiding wall surfaces extending downwardly and inwardly from respective corners thereof for retaining the flat package contacts in precise alignment with respect pads of the circuit board.

18 Claims, 7 Drawing Sheets

DEVICE FOR MOUNTING A FLAT PACKAGE ON A CIRCUIT BOARD

FIELD OF THE INVENTION

The invention relates to a device for mounting a flat package on a circuit board.

BACKGROUND OF THE INVENTION

The increasing microminiaturization and complexity of circuit board mounted components, particularly, flat package devices such as microprocessors having leads at very close pitch, requires a circuit board mounting device that can retain the flat package on the circuit board with the respective leads retained pressed into engagement with respective, correspondingly closely pitched solder pads or paths.

Such mounting devices should also be adapted for manufacture and assembly at high volume and low cost by mass production techniques and easily assembled with the flat package on the circuit board to ensure acceptably low applied cost while utilising conventional surface mount techniques.

Japanese Patent Publication No. 64-20693 discloses a mounting device for a flat package, which device includes a rectangular clamping frame having a rectangular resilient member on a clamping face thereof for pressing the respective leads against respective contact paths on the circuit board when the frame is clamped thereon to ensure reliable engagement even if the circuit board is warped.

However, although no precise method of attaching the resilient member to the clamping frame is taught, clearly both the size and configuration of the resilient member must be matched to that of the clamping face necessitating a wide inventory of different resilient members relatively costly both to manufacture and store.

In addition, no means are taught for retaining the flat package leads in precise alignment with the contact or solder paths of the circuit board while the frame is being attached by screws to the circuit board with the result that individual leads may shift from precise alignment with the corresponding conductive paths, resulting in no or poor connection.

SUMMARY OF THE INVENTION

It is one object of the invention to provide a flat package mounting device which ameliorates or obviates at least one of the above-mentioned disadvantages.

In particular, it is an object of the invention to provide a flat package mounting device having a clamping frame member to which a resilient, lead pressing member is adapted to be secured without a requirement for adhesive or additional separate mechanical fasteners.

It is a further object of the invention to obviate a requirement for maintaining an inventory of differently sized and configured resilient members for selection for correspondingly differently sized and configured clamping frames.

It is an additional object of the invention to provide means on the clamping frame for locating the flat package leads throughout application of the flat package to the circuit board.

In accordance with one aspect of the invention, a clamping frame of a flat package mounting device is formed with means to secure a lead pressing elastic strip thereto merely by resilient deformation of the strip.

In particular, the securing means comprises a plurality of stop surfaces formed at intervals around the frame and spaced from the clamping face, loop-form portions of said at least one elastic strip extending at spaced apart locations transversely away from the clamping face and hung from the respective stop surfaces.

Thus, a requirement for adhesive or other securing device is avoided while the clamping frame may be molded inexpensively in one-piece.

Suitably, the clamping frame is formed with elastic strip locating grooves extending around the clamping face ensuring precise location of the elastic strip.

The elastic strip may be an endless band, in which case, size differences may be accommodated within relatively wide limits, by stretching the band which can then simply be wound manually on the frame and secured with a snap action.

Alternatively, a single length of strip can be utilized and means may be provided on the frame to secure ends of such strip as a jam fit. In this case, the securing means further includes a plurality of elastic strip retaining channels formed in the frame at a location spaced from the clamping face, in which channels end portions of the strip are jammed in retaining engagement.

Although marked stretching of the strip may not be required, a degree of tension, necessarily producing an elongation of the elastic strip is preferred.

Suitably, the stop surfaces are formed in the upper face of the clamping frame.

The strip may be of uniform, circular cross-section facilitating securement to the frame as a degree of twist can be tolerated without adversely affecting the clamping pressure.

In a particular construction, the means for attaching the clamping frame to the circuit board includes an outer, rectangular, base frame formed with internally protruding, lead guiding surfaces at locations spaced apart from each other by distances substantially the same as the separation of remote edges of outermost legs of each row, and receiving the flat package therein with sliding engagement of the guiding surfaces and said remote edges, precisely to position the respective legs on respective conductive paths.

Preferably, the guiding surfaces are inclined downwardly as they extend inwardly to a circuit board engaging face for progressive guiding engagement with respective remote edges of outermost legs.

The base frame may be premounted on the circuit board and the flat pack placed thereon thereby ensuring accurate positioning of the leads during the application of the clamping frame.

In one arrangement, the clamping frame is rectangular and the stop surfaces are formed at respective corners of an upper face thereof and elastic strip locating grooves extend along sides thereof at the clamping face, recesses are formed in respective outer corners, said at least one strip extends between opposite ends of adjacent locating grooves, through the recesses and around the stop surfaces, the clamping frame nesting within the base frame with the guide surfaces received in the recesses and between respective strip portions. The retaining channels may communicate with the stop surfaces ensuring a continuously defined path for the resilient strip assuring accurate and speedy manual location on the frame.

In a more specific construction, the clamping frame includes an internally extending lip for clamping engagement with the flat package body. The attachment means may comprise a one-piece cover member having a frame-like body with locking legs terminated by transversely extending locking feet depending from respective opposite sides of the body and the base member is formed with outwardly extending latching protruberences slidingly engagable with the feet for mounting the cover member on the base member with the body in engagement with the clamping member thereby to retain the clamping member in pressing engagement with the flat package.

BRIEF DESCRIPTION OF THE DRAWINGS

A specific embodiment of the invention will now be described by way of example only and with reference to the accompanying drawings in which:

FIG. 7;

DESCRIPTION OF PREFERRED EMBODIMENT

Figure 1:
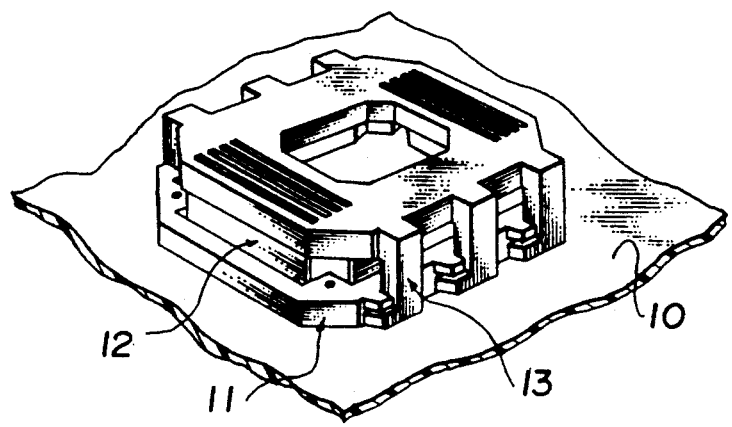
FIG. 1 is a perspective view of the mounting device according to the invention, installed on a printed circuit board.
Figure 2:
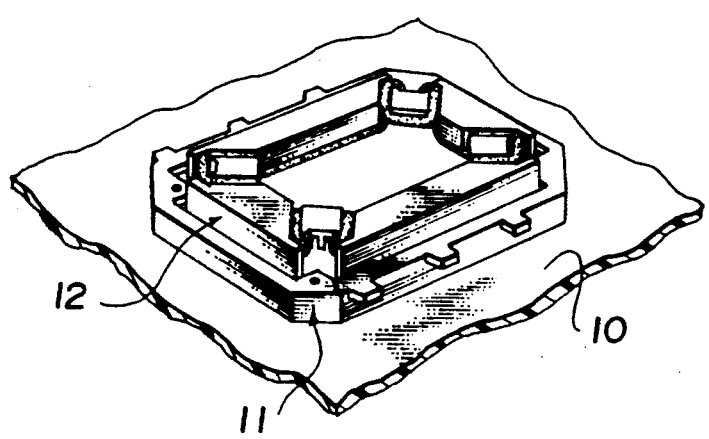
FIG. 2 is a similar view of the device with a cover removed.
Figure 3:
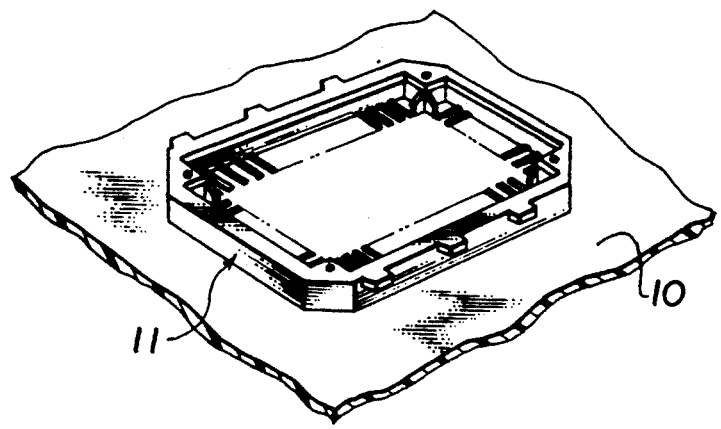
FIG. 3 is a similar view of a base frame of the device.

As best seen in FIGS. 1-3, the mounting device comprises a base frame 11 attached to a printed circuit board 10, a clamping frame 12 and a cover frame 13 for releasable locking engagement with the base frame for retaining the clamping frame within the base frame in engagement with a flat package mounted on the circuit board.

Figure 4:
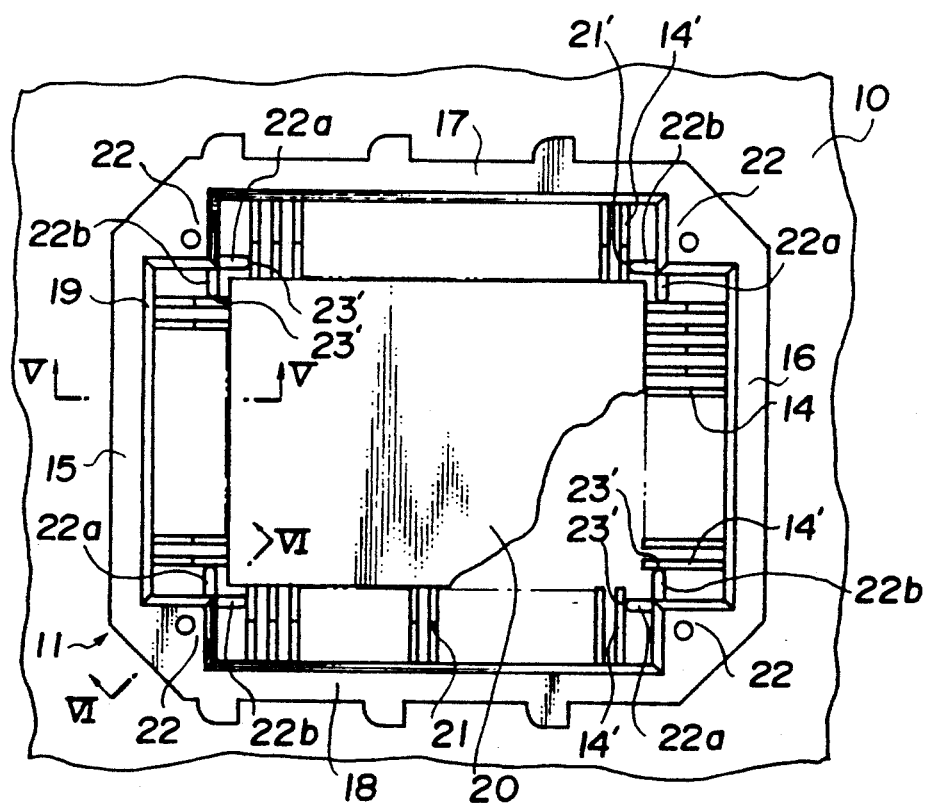
FIG. 4 is a plan view of the base frame placed on a circuit board with a flat package received inside the base frame.
Figure 5:
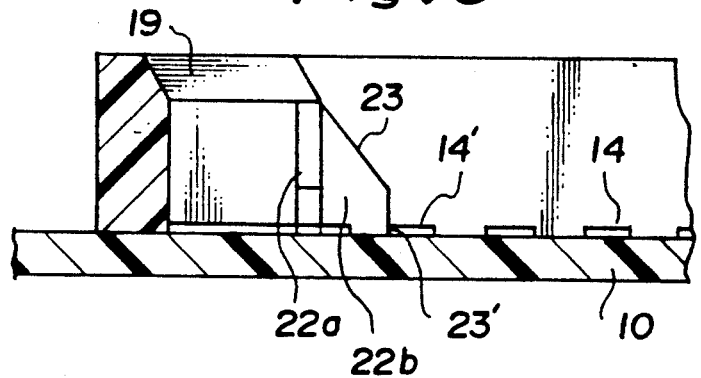
FIG. 5 is a fragmentary cross-sectional view taken along line V—V of FIG. 4.

As best seen in FIGS. 4 and 5, the base frame 11 comprises four walls 15, 16, 17, and 18, respectively, forming a rectangular enclosure surrounding solder pads or conductive paths 14 arranged on the board at the same close pitch as resilient contact legs 21 of the flat package integrated circuit 20. Upper, inner corners of the walls are beveled to provide guiding entry surfaces and right angled block portions 22 protrude internally at respective corners, defined by the intersections of the respective walls. Secondary, thin-walled projections 22a, extend from respective walls forming the projections in coplanar relation with respective inner faces thereof and have inwardly and downwardly sloping inside edges 23 terminating at respective lower, vertically extending locating portions 23' which are aligned with outer edges of outermost solder pads or paths 14'.

Respective leads 21 are accurately positioned on respective conductive paths 14 by inserting the flat package in the base frame 11. During insertion, the flat package 20 is guided by engagement of the remote edges of the outermost leads 21' with the guide surface portions 23 of the secondary projections 22a or 22b ensuring that the leads 21 are accurately positioned on respective solder pads 14.

Constructing the secondary projections 22a and 22b in the aforementioned fashion is advantageous in reducing the contact area between the secondary projections 22a and 22b and the leads and conserving the material of the base member 11, but it is also possible to extend the inner surfaces of the projections 22 to positions corresponding to the inner locating surfaces of the secondary projections 22a and 22b, instead of forming such projections.

Figure 6:
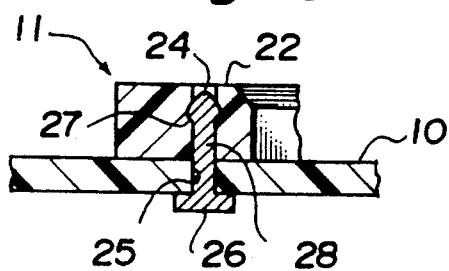
FIG. 6 is a fragmentary cross-sectional view along line VI—VI of FIG. 4.
Figure 7:
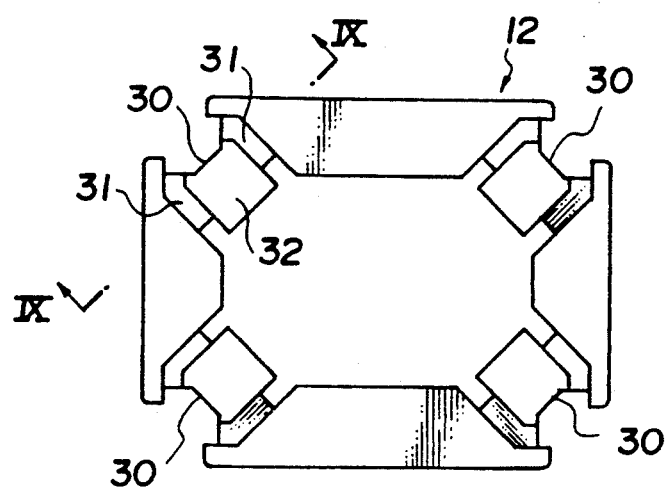
FIG. 7 is a plan view of a clamping frame of the device.
Figure 8:
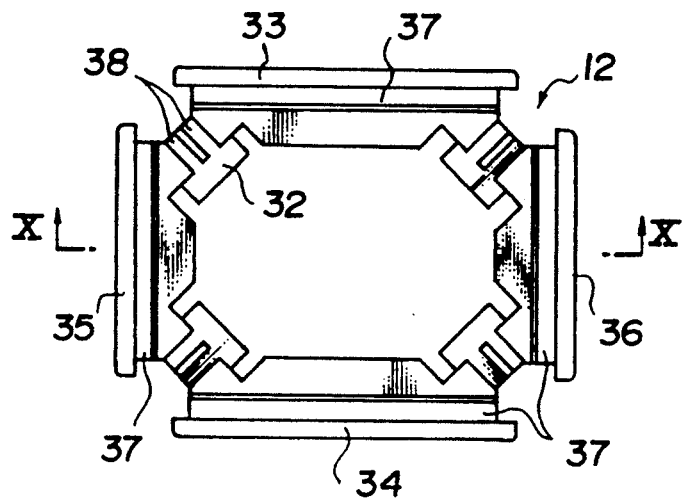
FIG. 8 is an underplan view of the clamping frame of FIG. 7.
Figure 9:
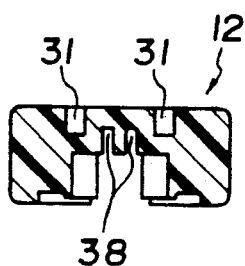
FIG. 9 is a cross-sectional view along line IX—IX of FIG.
Figure 10:
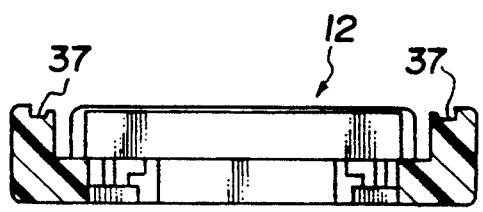
FIG. 10 is a cross-sectional view along line X—X of FIG. 8.
Figure 11:
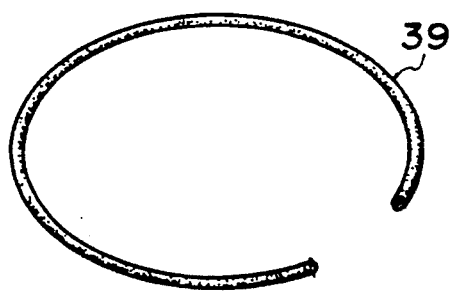
FIG. 11 is a perspective view of an elastic strip, partly cut-away.
Figure 12:
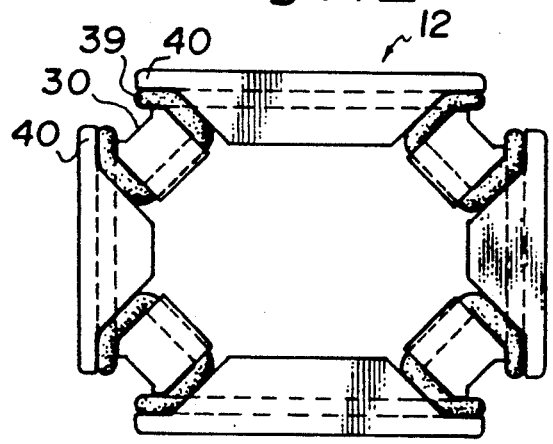
FIG. 12 is a plan view of the clamping frame with the elastic strip secured thereto.
Figure 13:
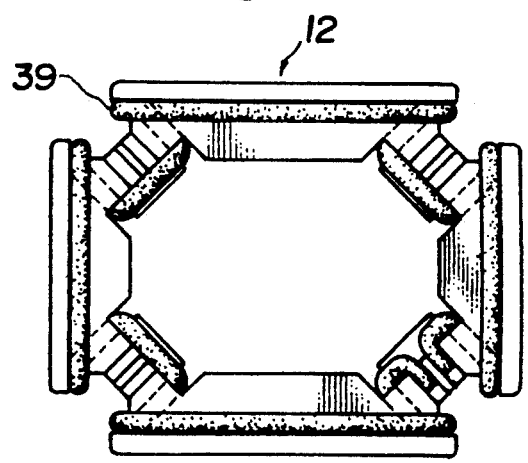
FIG. 13 is an underplan view of the clamping frame with the elastic strip secured thereto.
Figure 14:
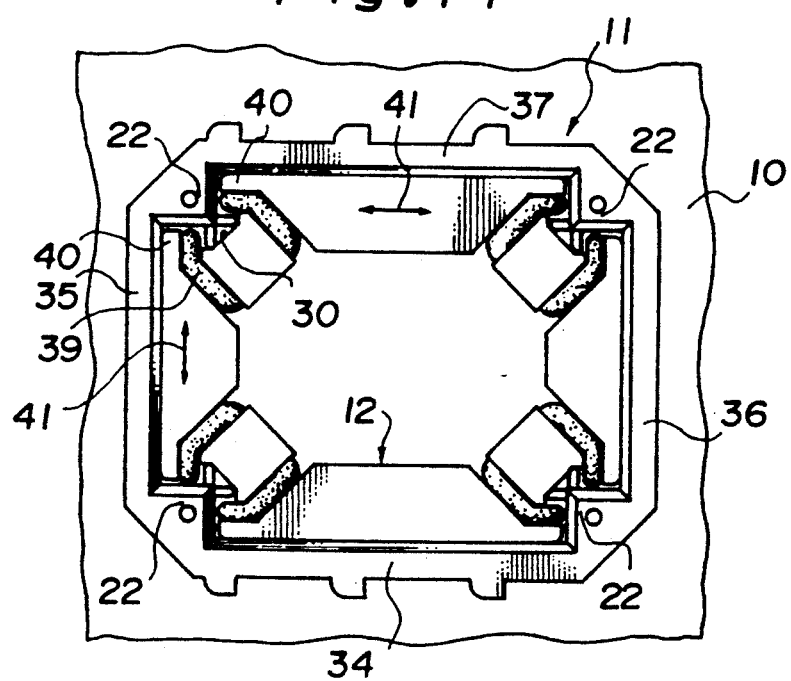
FIG. 14 is a plan view of a subassembly of the clamping frame received in the base frame installed on a circuit board.
Figure 15:
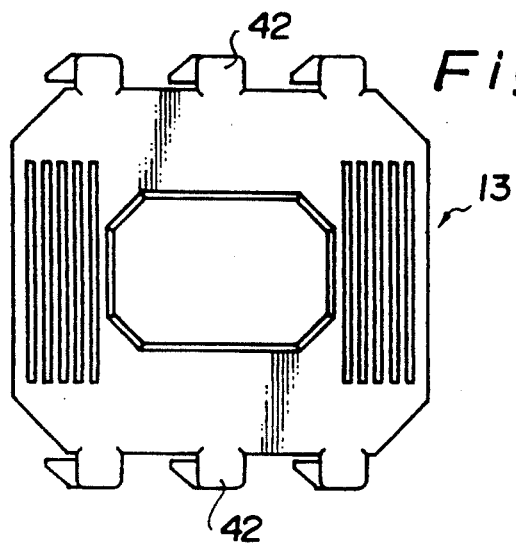
FIG. 15 is plan view of a cover of the device.
Figure 16:
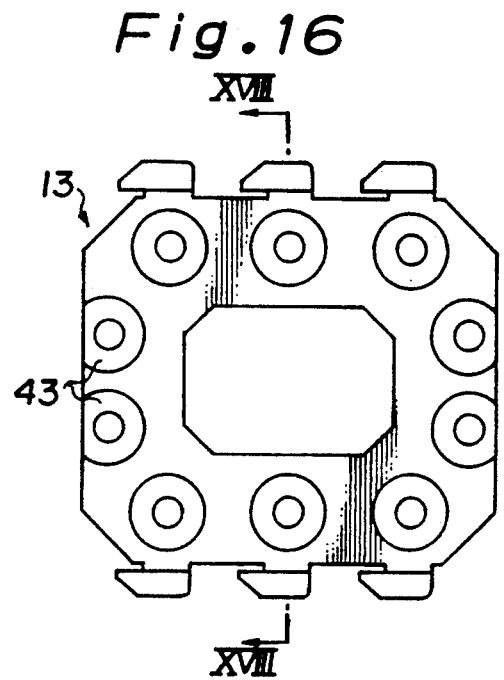
FIG. 16 is an underplan view of the cover of FIG. 15.
Figure 17:
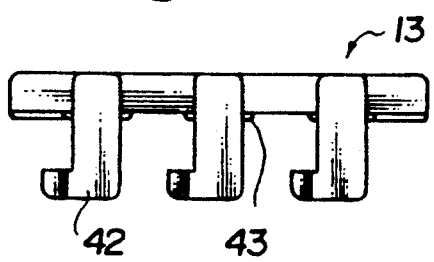
FIG. 17 is a side elevational view of the cover of FIG. 15.
Figure 18:
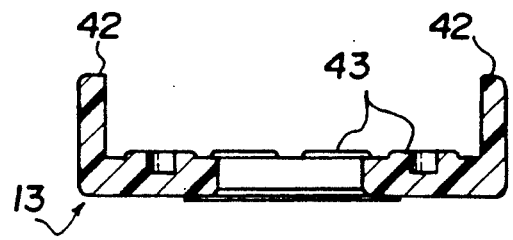
FIG. 18 is a cross-sectional view taken along line XVIII—XVIII of FIG. 16.

As best seen in FIG. 6, an anchoring hole 24 extends through each corner of the base 11 for alignment with a corresponding anchoring hole 25 made in a corresponding position in the circuit board 10. A stud-like anchoring post 28 having an enlarged head 26 and a radially enlarged free end 27, is force fitted into the hole 24 from below the circuit board securely to attach the base member to the circuit board.

Alternatively, other fastening means such as a screw may be provided with the hole 24 being formed as a threaded aperture for engagement therewith.

As best seen in FIGS. 7-10, the clamping frame 12 is rectangular, having opposite pairs of side walls 33, 34 and end walls 35 and 36, respectively. Recesses 30 are formed in respective corners of the clamping frame 12 and lands 32 forming stop surfaces and having elastic strip locating grooves 31 formed on opposite sides thereof. Further elastic strip locating grooves 37 and elastic strip anchoring grooves 38 of constricted cross-sectional size extend along the lower, clamping face and on the underside of the lugs 32.

As best seen in FIGS. 11-14, the elastic strips can be either endless (closed) rings or of indeterminate length and of uniform circular cross-section. The strips are formed periodically into loops which engage over inner sides of the stop surfaces of the lugs to hang therefrom, received in the locating grooves 31 and 37 and, if not endless, have opposite ends jammed in respective grooves 38 so that they are firmly retained on the clamping frame. Thus located, portions of the elastic strip 39 which are located in the recesses 30 project outwardly slightly from the longitudinal ends of the frame parts 34, 35, 36, and 37 against the respective inner surfaces of the projections 22 of the base frame 11 providing small clearances between ends 40 of the respective frame parts 33, 34, 35, and 36 and the inner surfaces of the projections 22 the strip resiliency both enabling the clamping frame to be received as a force fit within the base frame for temporary attachment thereto while the cover 13 is disengaged, and providing a restoring force to return the clamping frame to a precisely centered position in the event of inadvertent dislodgment by external forces in the directions of the arrows 41.

As best seen in FIGS. 15-18, the cover 13 is molded in one piece with L-shaped locking legs 42 depending downwardly on respective opposite sides thereof. Several circular protruberences are formed on a lower surface of the cover for reducing frictional engagement with the upper surface of the clamping frame 12.

Figure 19:
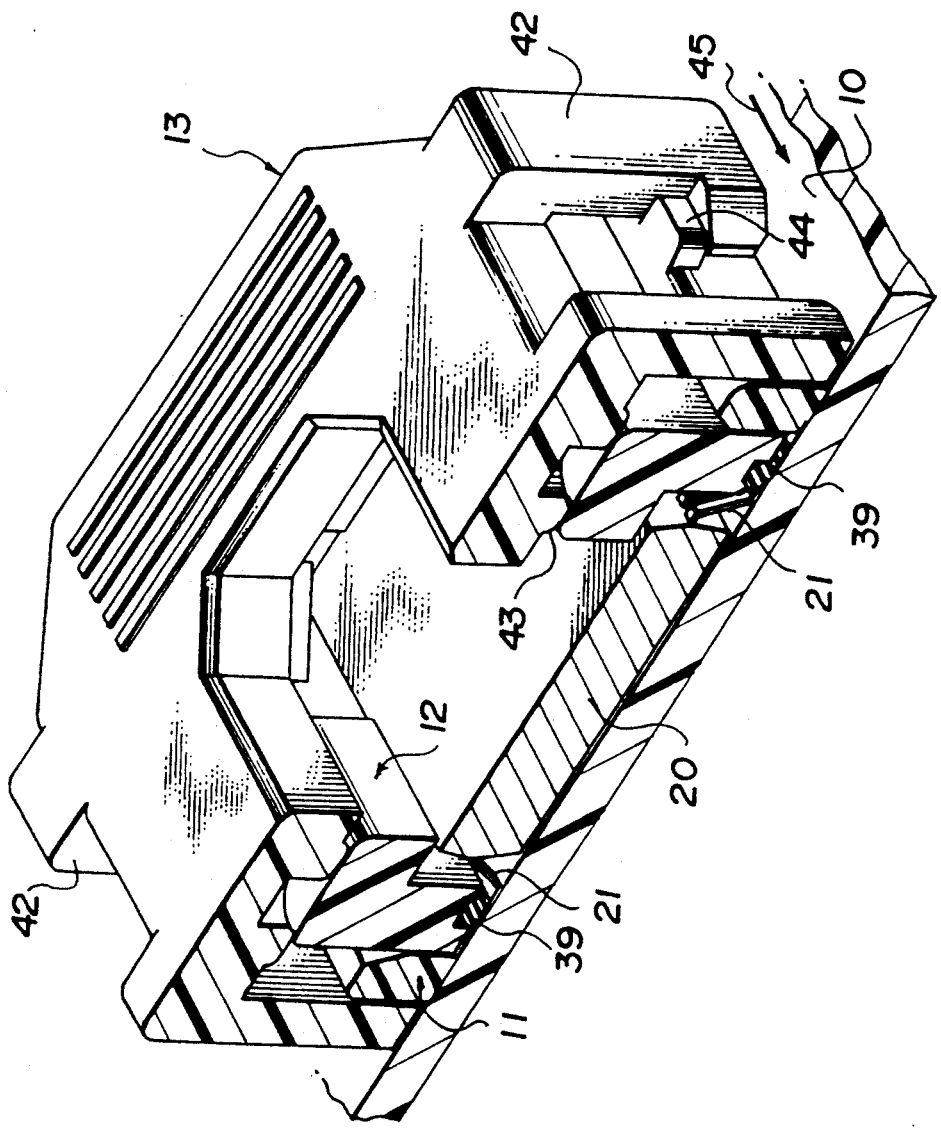
FIG. 19 is a perspective view, partly in cross-section of the fully assembled mounting device installed on a circuit board with a flat package received therein, clamped against the circuit board.

As best seen in FIG. 19, in the fully assembled condition the flat package IC 20 has been inserted into the base 11 and is retained attached to the circuit board with leads 21 thereof engaged on the respective contact paths or pads of the circuit board by the cooperation of the cover and the clamping frame 12. The locking legs 42 of the cover have been passed vertically between and below locking lugs 44 molded opposite edges of the base frame 11, and the cover frame 13 is then slid in the direction of the arrow 45 until the locking feet and lugs are engaged thereby causing the cover to press the clamping frame 12 downwardly with the elastic strip 39 pressing the respective leads 21 of the flat package onto the respective solder pads of the printed circuit board.

It will be apparent that, as a consequence of the invention, the elastic strip does not need to be matched precisely to the shape and size of the clamping face of the clamping frame but the flexural and resilient properties of the elastic strip can be utilized to conform with the locating grooves and stop surfaces so that only a strip of single size is required for secure attachment to clamping frames which vary widely in size and shape.

Furthermore, looping portions of the elastic strip at intervals around the stop surfaces of the clamping frames enable the elastic strip to be secured to the frame by simple manipulation and with a snap action.

The specific provision of the flat package guiding surfaces on the base frame obviates the misalignment problem associated with the prior art construction, while further precision is obtained by the interaction of the elastic strip with the surfaces of the guiding projections 22 formed in the respective corners of the base frame.

I claim:

1. A device for mounting a flat package on a circuit board, such flat package having series of leads extending in rows from edges thereof at pitches corresponding to pitches of contact paths on the circuit board, the device comprising:
   at least one elastic strip;
   a one-piece clamping frame having a lower, annular clamping face and formed with mechanical means securing said at least one elastic strip by resilient deformation thereof extending around the frame along the clamping face in alignment with said series of leads, the mechanical means comprising a plurality of stop surfaces formed at intervals around the frame and spaced from the clamping face, loop-form portions of said at least one elastic strip extending at spaced apart locations transversely away from the clamping face and hung from the respective stop surfaces and,
   means for attaching the clamping frame to the circuit board with the said at least one elastic strip pressing respective leads against respective contact paths.

2. A device according to claim 1 in which the clamping frame is formed with elastic strip locating grooves extending around the clamping face.

3. A device according to claim 2 in which the stop surfaces are formed in the upper face of the clamping frame.

4. A device according to claim 2 in which the elastic strip is of uniform, circular cross-section.

5. A device according to claim 2 in which the elastic strip is endless.

6. A device according to claim 1 in which the mechanical means securing said at least one elastic strip further includes a plurality of elastic strip retaining channels formed in the frame at a location spaced from the clamping face, in which channels end portions of the strip are jammed in retaining engagement.

7. A device according to claim 1 for use with a flat package having a rectangular body with the series of leads arranged as rows of resilient, flexible contact legs, in which the means for attaching the clamping frame to the circuit board includes an outer, rectangular, base frame formed with inwardly protruding, lead guiding surfaces at locations spaced apart from each other by distances substantially the same as the separation of remote edges of outermost legs of each row, and receiving the flat package therein with sliding engagement of the guiding surfaces and said remote edges, precisely to position the respective legs on respective conductive paths.

8. A device for mounting a flat package on a circuit board, such flat package having a rectangular body with series of leads arranged as rows of resilient, flexible contact legs extending from edges thereof and at pitches corresponding to pitches of contact paths on the circuit board, the device comprising:
   at least one elastic strip;
   a one-piece clamping frame having a lower, annular clamping face and formed with mechanical means securing said at least one elastic strip by resilient deformation thereof extending around the frame along the clamping face in alignment with said series of leads; and
   means for attaching the clamping frame to the circuit board with the said at least one elastic strip pressing respective leads against respective contact paths including an outer, rectangular, base frame formed with inwardly protruding, lead guiding surfaces at locations spaced apart from each other by distances substantially the same as the separation of remote edges of outermost legs of each row, and receiving the flat package therein with sliding engagement of the guiding surfaces and said remote edges, precisely to position the respective legs on respective conductive paths.

9. A device according to claim 8 in which the guiding surfaces are inclined downwardly as they extend inwardly to a circuit board engaging face for progressive guiding engagement with respective remote edges of outermost legs.

10. A device according to claim 9 in which the clamping frame includes an internally extending lip for clamping engagement with the flat package body.

11. A device according to claim 8 in which the clamping frame is rectangular and the mechanical means securing said at least one elastic strip comprises stop surfaces formed at respective corners of an upper face thereof and elastic strip locating grooves extend along sides thereof at the clamping face, recesses are formed in respective outer corners, said at least one strip extends between opposite ends of adjacent locating grooves, through the recesses and around the stop surfaces, the clamping frame nesting within the base frame with the guide surfaces received in the recesses and between respective strip portions.

12. A device according to claim 11 in which the frame is formed with right-angled corner portions protruding inwardly of the frame with inner, transversely extending, vertical faces and pairs of the guide surfaces are by formed by thin-walled portions extending perpendicularly to each other and coplanar with respective transverse faces of the respective right-angled corner portions.

13. A device according to claim 11 in which the elastic strip retaining channels communicate with the stop surfaces.

14. A device according to claim 8 in which the attachment means comprises a one-piece cover member having a frame-like body with locking legs terminated by transversely extending locking feet depending from respective opposite sides of the body and the base member is formed with outwardly extending latching protuberences slidingly engagable with the feet for mounting the cover member on the base member with the body in engagement with the clamping member thereby to retain the clamping member in pressing engagement with the flat package.

15. A device for mounting a flat package on a circuit board, such flat package having series of leads extending from edges thereof at pitches corresponding to pitches of contact paths on the circuit board, the device comprising:
   at least one elastic strip;
   a one-piece clamping frame having a lower, annular clamping face and formed with means securing said at least one elastic strip thereto comprising elastic strip locating grooves extending around the frame along the clamping face, a plurality of stop surfaces formed at intervals around the frame on an upper surface, said at least one elastic strip extending along the grooves and formed at spaced apart locations into loop portions extending out of the grooves, transversely away from the clamping face and hung around the respective stop surfaces;
   means for attaching the clamping frame to the circuit board with the said at least one elastic strip pressing respective leads against respective contact paths.

16. A device for mounting a flat package on a circuit board, such flat package having rows of contact legs extending from edges thereof at pitches corresponding to pitches of contact paths on the circuit board, the device comprising:
   a one-piece clamping frame having a lower, annular clamping face having an elastic member located thereon aligned for pressing engagement with respective leads for urging them against corresponding contacts of the circuit board,
   means for attaching the clamping frame to the circuit board including a base frame formed with inwardly protruding, lead guiding surfaces at locations spaced apart from each other by distances substantially equal to the separation of remote edges of outermost legs of each row, and receiving the flat package therein with sliding engagement of the guiding surfaces and said remote edges, precisely to position the respective legs on respective conductive paths.

17. A device according to claim 16 in which the leg guiding surfaces are inclined downwardly as they extend inwardly to a circuit board engaging face for progressive guiding engagement with respective remote edges of outermost legs.

18. A device according to claim 17 in which the frame is formed with inwardly protruding right-angled corner portions with inner, transversely extending, vertical faces and pairs of the lead guiding surfaces are by formed by thin-walled portions extending perpendicularly to each other and coplanar with respective transverse faces of the respective right-angled corner portions.

* * * * *